United States Patent
Tachikawa et al.

(10) Patent No.: US 6,805,742 B2
(45) Date of Patent: Oct. 19, 2004

(54) SILICON SEMICONDUCTOR SUBSTRATE AND PROCESS FOR PRODUCING THE SAME

(75) Inventors: Akiyoshi Tachikawa, Hikari (JP); Kazunori Ishisaka, Hikari (JP); Atsushi Ikari, Tokuyama (JP)

(73) Assignee: Siltronic AG, Munich (DE)

(*) Notice: Subject to any disclaimer, the term of this patent is extended or adjusted under 35 U.S.C. 154(b) by 93 days.

(21) Appl. No.: 10/213,470

(22) Filed: Aug. 7, 2002

(65) Prior Publication Data

US 2003/0079674 A1 May 1, 2003

(30) Foreign Application Priority Data

Aug. 9, 2001 (JP) ........................................ 2001-242498

(51) Int. Cl.$^7$ .............................................. C30B 15/20
(52) U.S. Cl. ............................ 117/30; 117/13; 117/20; 117/32
(58) Field of Search .............................. 117/13, 14, 19, 117/20, 30, 32

(56) References Cited

U.S. PATENT DOCUMENTS 5,738,942 A    4/1998   Kubota et al.

FOREIGN PATENT DOCUMENTS

| EP | 090 320 | 10/1983 |
|---|---|---|
| EP | 942 078 | 9/1999 |
| GB | 2 080 780 | 2/1982 |
| JP | 2000-211995 | 8/2000 |

OTHER PUBLICATIONS

Jpn J. Appl. Phys vol. 3/(1998) pp L196–L199.

Patent Abstract of Japan corresponding to JP2000–281490.

*Primary Examiner*—Felisa Hiteshew
(74) *Attorney, Agent, or Firm*—Collard & Roe, P.C.

(57) ABSTRACT

A semiconductor substrate after heat-treatment in a non-oxidising atmosphere has the characteristics that the depth of the denuded zone may be greater than 12 μm or the defect-free depth of the void type defect is greater than 12 μm and the substrate has a locally densified portion produced by nitrogen segregation and exhibiting a signal strength two or more times the average signal strength at the depth of 12 μm or more below the surface thereof when measuring the concentration of nitrogen by using secondary ion mass-spectroscopy, and the density of the crystal defect of oxygen precipitates is $5 \times 10^8/cm^3$ or more, and the said substrate is produced by heat-treating for at least one hour at the temperature of 1200° C. or more in a non-oxidising atmosphere.

9 Claims, No Drawings

SILICON SEMICONDUCTOR SUBSTRATE AND PROCESS FOR PRODUCING THE SAME

BACKGROUND OF THE INVENTION

1. Field of the Invention

The present invention relates to a silicon semiconductor substrate obtained, by slicing, from a silicon single crystal which has been produced by pulling up the silicon single crystal by Czochralski method (CZ method) or magnetic field-applied Czochralski method (MCZ method) while controlling the cooling rate in a range from the coagulation temperature to the crystallising temperature of a single crystal and also controlling the concentration of nitrogen, the concentration of oxygen and the like. The invention also relates to a process for producing the same.

2. The Prior Art

As for the semiconductor substrates used to make devices such as semiconductor integrated circuits, semiconductor substrates obtained, by slicing, from a silicon single crystal grown by Czochralski method or magnetic field-applied Czochralski method are used mainly. Along with the recent improvement in the integration of devices, the presence of micro defects on the surface of a silicon semiconductor substrate or in the vicinity of the surface layer of a silicon semiconductor substrate causes operational failures of the device. A highly integrated device has such a fine structure that the pattern dimension thereof is 0.3 μm or less. Therefore, it is known that crystal defects of 0.1 μm in size also cause operational failures of the devices, thereby decreasing the yield of the production of the device.

As for the Grow-in defects during the growth of a silicon single crystal causing the reduction in the yield of a device, ring stacking faults (R-SF), dislocation clusters and the like occur in a zone where interstitial silicon is dominant, and cavity defects, namely void type defects (COP, LSTD, FPD) and AOP occur in a zone where voids are dominant. Because R-SF are driven out of a crystal when the crystal is grown in the CZ method or the MCZ method, most of the defects are void defects. As this void defect, COP (Crystal Originated Particles), a void of about 0.1 μm in size formed on a substrate just after the substrate is produced, has been attracting considerable attention. In a silicon single crystal grown by the CZ method or the MCZ method, the substance of this defect is considered to be a void in the crystal having an octahedral shape, which is estimated to cause pattern failures and structural destruction of the device.

In the production of a silicon single crystal by the CZ method or the MCZ method, quartz is used as the crucible. Oxygen eluted from the quartz crucible while pulling up a single crystal is moved by the flow and diffusion of the silicon melt and a large part of oxygen is evaporated as SiO gas from the surface of the melt. However, a part of the oxygen is incorporated into the crystal at high temperature, and the content of oxygen is supersaturated in the course of cooling the crystal, forming, in the crystal, micro-defects (BMD) of oxygen precipitates with a diameter of several hundreds nm or less and consisting of $SiO_2$ or $SiO_x$. When a semiconductor which has been sliced from a single crystal is heat-treated before or in the course of producing electronic devices such as DRAM, the micro-defects of oxygen precipitates become extinct on the surface layer portion of the semiconductor substrate which is the active area of the electronic device and it is possible to increase the density of the micro-defects (BMD) in a deep zone far apart from the substrate surface and to increase the size of the oxygen precipitates.

However, when heavy metal impurities such as Cr, Fe, Ni and Cu are present on the surface portion of a silicon semiconductor substrate sliced from a silicon single crystal, this causes the deterioration of the characteristics of the device when producing an electronic device. It is therefore necessary to confine the heavy metal impurities at positions far apart from the active area of the device, namely from the surface layer portion. For this, by utilising BMD, heavy metal impurities such as Cr, Fe, Ni and Cu may be precipitated as a silicide on or in the vicinity of BMD by intrinsic gettering (IG), whereby a denuded zone (DZ) can be produced in the surface layer portion of the semiconductor substrate.

It is known that the depth of the denuded zone and the density of the micro-defect inside a semiconductor substrate depend upon the concentration of oxygen and the concentration of nitrogen in a silicon single crystal and the cooling rate during the growth of the single crystal. For this, the concentration of oxygen, the concentration of nitrogen and the cooling rate have been controlled to control the silicon defect-free layer and the density of the micro-defects in the inside.

A proposal for improving the denuded zone of a void-type defect and for improving the intrinsic gettering (IG) effect is presented in the publication of JP-A-2000-211995. In this publication, a silicon single crystal wafer is disclosed, wherein the depth of the defect-free surface layer is 2 to 12 μm and the C-mode non-defective ratio of TZDB (Time Zero Dielectric Breakdown), showing the evaluation of the voltage resistance quality of an oxide film is 90% or more. Also, it is disclosed in Claim 2 that the concentration of nitrogen in a silicon single crystal wafer is $1 \times 10^{12}$ to $1 \times 10^{15}$ atoms/cm$^3$.

Further, it is disclosed in Claim 4 that the concentration of oxygen in the silicon single crystal wafer is 9 to 17 ppma, and in Claim 5, that a silicon single crystal bar is grown in a manner that the cooling rate in a temperature range from 1150° C. to 1080° C. during the growth of the crystal is controlled to be in a range from 1.0 to 4.5° C./min. The following fact is shown in the example: it is necessary for the concentration of oxygen to be 10 ppma in an 8 inch silicon single crystal mirror surface wafer to satisfy the condition for the denuded zone (DZ) to actually extend to a depth up to 12 μm.

PROBLEMS TO BE SOLVED BY THE INVENTION

In the said known art, in a silicon single crystal wafer, a denuded zone is formed only to the depth of 12 μm (evaluation by COP number) by selecting an oxygen concentration of 9 to 17 ppma when the concentration of nitrogen is in the range from $1 \times 10^{12}$ to $1 \times 10^{15}$ atoms/cm$^3$, and a silicon single crystal wafer with the depth of the denuded zone larger than 12 μm could not be produced.

In view of the aforementioned situation, the present invention is to provide a silicon semiconductor substrate in which the denuded zone (DZ) is deeper than 12 μm or the depth of the denuded zone of a void type defect is larger than 12 μm, the semiconductor substrate having a portion with locally increased nitrogen concentration which is produced by nitrogen segregation and exhibiting a signal strength two or more times the average signal strength at the depth of 12 μm or more below the surface thereof when measuring the concentration of nitrogen by secondary ion mass-spectroscopy, and having a high freedom in the production of electronic devices and a high device yield. The present invention is also to provide a process for producing the same.

In the present invention, the defect-free depth of a void type defect means the depth from the surface of a semiconductor substrate when the acceptable density is designed to be $2 \times 10^5$ or less in terms of the density of a COP (Crystal Originated Particle) with a size of 0.1 μm or more which appears by repeated washing using SC1 or the like. Also, the acceptable depth for withstanding voltage means the depth from the surface of a semiconductor substrate where the substrate withstands the voltage of 11 MV/cm or more at 100 mA/cm$^2$ at a successful rate exceeding 90% in a TZDB (Time Zero Dielectric Breakdown) test.

In the present invention, the depth of the denuded zone is evaluated by the depth having both values of the depth of the void type defect and the acceptable depth for withstanding voltage.

The density of oxygen precipitates, expressed as BMD (bulk micro-defect) density, means the density of micro-defects caused by $SiO_2$ resulting from the precipitation of heat-treated interstitial oxygen solved as a supersaturated solid solution in a silicon single crystal and micro-defects resulting from a dislocation caused by a stacking fault along with the formation of $SiO_2$.

DESCRIPTION OF THE INVENTION

The above problems are solved by a silicon semiconductor wafer obtained from a silicon single crystal grown by a method selected from the group consisting of Czochralski method and a magnetic field-applied Czochralski method, the silicon semiconductor wafer comprising, after heat-treatment in a non-oxidising atmosphere, a denuded zone with a depth of at least 12 μm and a crystal defect density of oxygen precipitates of at least $5 \times 10^8$/cm$^3$ at a centre of a thickness of the silicon semiconductor wafer.

The non-oxidising atmosphere may be a non-oxidising atmosphere comprising nitrogen, hydrogen, argon or a mixture of these gases. The depth of the denuded zone after the silicon semiconductor substrate is heat-treated in a non-oxidising atmosphere can be made much greater than 12 μm and the crystal defect density of oxygen precipitates can be made to be $5 \times 10^8$/cm$^3$ or more at the centre of the thickness of the silicon semiconductor substrate. Also, as is clear from the fact that a locally densified portion produced by nitrogen segregation and which exhibits a signal strength two or more times the average signal strength at the depth of 12 μm or more when measuring the concentration of nitrogen by using a secondary ion mass-spectroscopy is deeper than 12 μm, it is understood that the intrinsic gettering effect is large and the depth of the denuded zone is large. Therefore, the substrate has a wide area where electronic devices can be formed and a high gettering ability.

Preferably, a silicon semiconductor substrate which has been sliced from a silicon single crystal pulled up by Czochralski method or magnetic field-applied Czochralski method, having an oxygen concentration of $9.5 \times 10^{17}$ atoms/cm$^3$ or less (the lower, the better), a nitrogen concentration of $5 \times 10^{14}$ atoms/cm$^3$ or more and $1 \times 10^{16}$ atoms/cm$^3$ or less, and the maximum signal strength of which measured at the centre thereof by an infrared interference method (OPP) is 2 V or less, is selected and heat-treated in a non-oxidising atmosphere, for example, an argon-hydrogen mixture. The heat-treated semiconductor substrate has the characteristics that the concentration of oxygen at the depth of 1 μm below the surface in the centre of the semiconductor substrate is $5 \times 10^{16}$ atoms/cm$^3$ or less and the concentration of oxygen at the centre of the thickness of the semiconductor substrate is $9.5 \times 10^{17}$ atoms/cm$^3$ or less when measured by secondary ion mass-spectroscopy (SIMS). The depth of the void type defect estimated by repeated cleaning using SC1 of the semiconductor substrate is extended to the area deeper than 12 μm and the depth, where more than 90% yield at the wafer for high C mode yield of GOI measurement at the semiconductor substrate is accomplished is extended to the area deeper than 12 μm, for example, even by 0.5 μm. here, High C mode is the measurement condition in GOI(Gate Oxide Integrity), That is gate oxide breakdown judgment within the range of over 11 MV/cm at current density of 100A/cm2 at the 20 mm2 chip area deposited 20 nm thin gate oxide.

No defect, especially void type defect area from the surface is named the denuded zone of void type defect that estimated by repeated cleaning using SC1. On the other hand, defect area from the surface estimated to be judged the more than 90% high C mode yield of GOI is named the denuded zone since after sentence.

The reason why $5 \times 10^{14}$ atoms/cm$^3$ is selected as the lower limit of the nitrogen content of the silicon semiconductor substrate before heat-treatment is that a value lower than the selected value brings about an insufficient effect of decreasing the size of the surface layer defect and therefore the extinction of the surface layer defect in the subsequent heat-treatment becomes difficult. Also, the reason why $1 \times 10^{16}$ atoms/cm$^3$ is selected as the upper limit of the nitrogen content is to prevent the polycrystallisation caused by the precipitation of nitrogen exceeding the limit of solid solution when a single crystal is pulled up, thereby avoiding a change in electronic characteristics such as carrier life time and resistance. Also, even when the concentration of nitrogen is within the range between $5 \times 10^{14}$ atoms/cm$^3$ and $1 \times 10^{16}$ atoms/cm$^3$, the defect becomes larger when the cooling rate during pulling-up is low and it is therefore desirable to adopt the condition of the cooling rate of 5° C./min or more to attain a denuded zone with the thickness of 12 μm or more from the surface. However, it is difficult to set the cooling rate to 5° C./min at the-temperature of 1100° C. in order to obtain a silicon semiconductor substrate of 200 mm or more in size according to the recent demands for large diameter wafers.

For this, in order to obtain a semiconductor substrate having a denuded zone with a depth of at least 12 μm and a crystal defect density of oxygen precipitates of at least $5 \times 10^8$/cm$^3$ at a centre of a thickness of the silicon semiconductor wafer also in large-diameter wafers, it is preferred to decrease the size of the defect by increasing the amount of nitrogen to be added. In the present invention, For example, for large size wafer that is pulled slowly, the concentration of nitrogen in the silicon semiconductor substrate before the heat treatment in a non-oxidising atmosphere is preferably in the range between $1 \times 10^{15}$ atoms/cm$^3$ and $1 \times 10^{16}$ atoms/cm$^3$. In order to obtain a concentration of nitrogen in the silicon semiconductor substrate in the mentioned range, the concentration of nitrogen in the silicon melt needs to be in the range between $1 \times 10^{18}$ atoms/cm$^3$ and $1.5 \times 10^{19}$ atoms/cm$^3$.

The infrared interference method used in the present invention is also called an OPP method (Optical Precipitate Profiler), in which micro-defects in the vicinity of the surface of a semiconductor substrate is observed by scattered light. In this method, infrared laser light having a wavelength of, for example, 1.3 μm is divided into cross-polarised two beams having the diameter of 1 μm by using a polarising prism and converged on the surface of the semiconductor substrate (both beams are made to be overlapped on each other by 0.5 μm) and the focus area is raster-scanned in steps of 1 μm in the direction perpendicular to the moving direction of the beam while oscillating the semiconductor substrate to make the scattered light have a slight phase difference when one beam crosses a micro-defect thereby detecting the micro-defect by the interference with the other beam. In the present invention, the OPP signal strength means the maximum signal strength measured by the OPP method. It has been reported that there is a proportional relationship between the OPP signal strength and the volume of a void in case where the void is octahedral (Jpn. J. Appl. Phys. Vol. 37 (1998) PPL 196. 199). Also, the OPP method is used to measure the defect-free zone by moving the focus point in the direction of the depth of a semiconductor substrate.

In the present invention, the focus point is changed in the direction of the depth in the centre of a semiconductor substrate to detect signals. Preferably, the maximum signal strength of the semiconductor substrate before heat-treatment measured by infrared interference method is selected to be 2 V or less. This is because this selection is suitable for eliminating the defect in order to accomplish the denuded zone of 12 μm or more from the surface layer when the substrate is heat-treated using industrially suitable temperature and time. Further, in order to eliminate the void type defects having the defect size corresponding to 2 V or less within the range of the heat-treatment of the present invention, the internal wall oxide film must be first extinguished by external diffusion, then the voids must be diffused and interstitial silicon must be injected at the volume equal to that of the void type defects. It is preferred that the concentration of oxygen at the depth of 1 μm below the surface, after a heat treatment satisfying this condition, be $5 \times 10^{16}$ atoms/cm$^3$ or less.

Here, the concentration of oxygen accords to the following definition:

$$c = c_0 \text{erf} \frac{x}{2\sqrt{Dt}} \quad (1)$$

where
D: Diffusion constant of oxygen at the temperature of 1200° C.
$c_0$: Concentration of oxygen at the centre of the thickness of the wafer
t: Heat treating time at the temperature of 1200° C. or more
x: Depth from the surface.

The external diffusion of oxygen is represented by the error function of formula (1). A profile by SIMS is multiplied by the fitting of formula (1) by using the least squares method, and the concentration of oxygen when the depth x is 1 μm is defined as the concentration of oxygen described in the present invention. It has been confirmed through our experiment that there is the following relationship between the maximum signal strength by OPP and the actual volume of the void V observed by TEM in case where the nitrogen concentration in the melt and the nitrogen concentration in the silicon semiconductor substrate before the heat-treatment fall in the range defined in the present invention. The limitation by the OPP maximum signal strength leads to the limitation of the volume of the void.

When the cooling rate is 5° C./min or more, void volume V (nm$^3$)=20000×(OPP maximum signal strength)$^{1.6}$.

When the cooling rate is 1° C./min or more and less than 5° C./min, void volume V (nm$^3$)=110×(OPP maximum signal strength)$^{3.6}$.

Moreover, the present invention preferably uses a semiconductor substrate before heat-treatment having an oxygen concentration of $8.5 \times 10^{17}$ atoms/cm$^3$ or less, a nitrogen concentration of $1 \times 10^{15}$ atoms/cm$^3$ or more and $1 \times 10^{16}$ atoms/cm$^3$ or less and the maximum signal strength of 7 V or less when measured at the centre of the semiconductor substrate by infrared interference method. Therefore, the oxygen concentration of the heat-treated semiconductor substrate measured by secondary ion mass spectroscopy is $5 \times 10^{16}$ atoms/cm$^3$ or less at the depth of 1 μm from the surface and $8.5 \times 10^{17}$ atoms/cm$^3$ or less at the centre of the thickness of the semiconductor substrate. In this case, $1 \times 10^{15}$ atoms/cm$^3$ is selected as the lower limit of the nitrogen concentration of the semiconductor substrate before heat-treatment. The reason is as follows: When the cooling rate is low, the void type defect becomes larger than that of the wafer pulled at high cooling rate in size and it is therefore necessary to heighten the effect of contracting the void by adding nitrogen concentration in order to make this large void shrunk until the same size as the small void obtained at high cooling rate. For this, the nitrogen concentration of at least $1 \times 10^{16}$ atoms/cm$^3$ is required. Also, OSF (Oxidation Induced Stacking Faults), generated by the oxidation of the surface of the semiconductor substrate when the nitrogen concentration is higher than the above value, causes problems when the substrate is used as an epitaxial substrate. However, it has been confirmed that in case of the semiconductor substrate after heat-treatment, this OSF is externally diffused by heat-treatment and has no influence on electronic devices disposed on the surface layer of the semiconductor substrate. Also, the reason why the oxygen concentration at the centre of the thickness of the wafer is lower than that defined above (up to $8.5 \times 10^{17}$ atoms/cm$^3$ instead of up to $9.5 \times 10^{17}$ atoms/cm$^3$) is, that in the case where the cooling rate is low, the internal wall oxide film of the void defect is thickened and difficult to eliminate. Because internal wall oxide film grow thicker at the high oxygen concentration wafer. For this, it is necessary that the oxygen concentration in the wafer is designed to be $8.5 \times 10^{17}$ atoms/cm$^3$ or less. Further, the oxygen concentration at the depth of 1 μm in the surface layer must be $5 \times 10^{16}$ atoms/cm$^3$ or less for the same reason as mentioned above.

Further, the present invention relates to a silicon semiconductor wafer obtained from a silicon single crystal grown by Czochralski method or magnetic field-applied Czochralski method, wherein the oxygen concentration at the centre of the depth of the semiconductor substrate after heat-treatment in a non-oxidising atmosphere is $9.5 \times 10^{17}$ atoms/cm$^3$ or less, the semiconductor substrate has a locally densified portion produced by nitrogen segregation and exhibiting a signal strength two or more times the average signal strength at the depth of 12 μm or more below the surface thereof when measuring the concentration of nitrogen by using a secondary ion mass-spectroscopy (SIMS), and the depth of the denuded zone of a void type defect is 12 μm or more, whereby the crystal defect density of oxygen precipitates at the centre of the thickness thereof may be $5 \times 10^8$/cm$^3$ or more. In this case, the position having the signal strength twice the average signal strength is deeper than 12 μm, for example, 12.8 μm or 13.5 μm, when the concentration of nitrogen of the silicon semiconductor substrate is measured by secondary mass spectroscopy. This is shown by nitrogen spike (N Spike) depth. The invention of Claim 4 includes substrates in which, We have a possibility of production of 12 μm depth denuded zone judged by more than 90% yield at high C mode judgment by GOI or do not possibility of production of that quality semiconductor substrate, but the semiconductor substrate mentioned Claim 1 is accomplished 12 μm depth for both denuded zone by evaluated GOT and denuded zone of void type defect by repeated cleaning using SC1. As to the void type defects, it is a necessary and sufficient condition that the locally densified portion of nitrogen observed by SIMS measurement has the depth of 12 μm or more in order to obtain the denuded zone of void type defect untill 12 μm or more in depth. However, there is a case where it is insufficient even when the locally densified portion is 12 μm or more in depth. Therefore, It is necessary for the semiconductor substrate satisfied the quality of Claim 1 to decrease the size of the defects present before heat-treatment, that is to say, we need more detailed condition for the 12 μm depth denuded zone satisfied 90% yield of GOT evaluation, So it is necessary to limit the ranges of nitrogen concentration and cooling rate in the same manner as in Claims 2 and 3. Therefore, the silicon semiconductor substrate of Claim 1 fulfils the structure of the silicon semiconductor substrate of Claim 1. The other hand, since the defect in the definition of the non-defect is limited to the void type defect of 0.1 μm or more in size measured by a particle counter after cleaning using SC1 is repeated 10 times. For example, compared with Claim 5, Claim 2 permits only the defects having smaller OPP maximum signal strength. Therefore, as described in Claim 5, a silicon semiconductor substrate having a defect-free zone as to void type defects of 12 μm in size only requires an OPP signal strength of 4 V or less, because defect size larger than that of claim 2 is accepted. In a defect system of this size, it only requires the nitrogen concentration to be $2\times10^{14}/cm^3$ or more. Namely, in a pulling-up condition where the cooling rate is 5° C./min or more, the present invention, as described in Claim 5, reside in a semiconductor substrate obtained by selecting, as the silicon semiconductor substrate before heat-treatment, a substrate which has an oxygen concentration of $9.5\times10^{17}$ atoms/cm$^3$ or less and a nitrogen concentration of $2\times10^{14}$ atoms/cm$^3$ or more and $1\times10^{16}$ atoms/cm$^3$ or less and the maximum signal strength of which measured at the centre thereof by an infrared interference method (OPP) is 4 V or less and the substrate mentioned above is done heat-treatment in a non-oxidising atmosphere. Specifically, we obtain the high quality semiconductor substrate in which the concentration of oxygen at the depth of 1 μm below the surface in the centre of the semiconductor substrate is $5.0\times10^{16}$ atoms/cm$^3$ or less, the concentration of oxygen at the centre of the thickness of the semiconductor substrate is $9.5\times10^{17}$ atoms/cm$^3$ or less when measured by secondary ion mass spectroscopy, the depth of the denuded zone of the void type defect is larger than 12 μm and the depth of the locally densified portion produced by nitrogen segregation and exhibiting a signal strength two or more times the average signal strength when measuring the concentration of nitrogen by secondary ion mass-spectroscopy (SIMS) is larger than 12 μm.

When the cooling rate is 1° C./min or more and less than 5° C./min in case of a silicon semiconductor substrate having a denuded zone of a void type defect of 12 μm or more in size, the fact that the denuded zone of the void type defect is 12 μm or more in depth is the same as the fact that the acceptable depth in GOI evaluation is 12 μm or more as the characteristics of the silicon semiconductor substrate. In the case of the cooling rate 5° C./min or more, There is no different in evaluating results of defect free zone depth by repeated cleaning using SC1 and from the evaluation by GOI. The substrate mentioned Claim 5, which has an oxygen concentration of $8.5\times10^{17}$ atoms/cm$^3$ or less and a nitrogen concentration of $1\times10^{15}$ atoms/cm$^3$ or more and $1\times10^{16}$ atoms/cm$^3$ or less and the maximum signal strength of which measured at the centre thereof by an infrared interference method (OPP) is 7 V or less, is selected as the silicon semiconductor substrate before heat-treatment, and heat-treated in a non-oxidising atmosphere. After this heat-treatment, the semiconductor substrate has the characteristics that the concentration of oxygen at the depth of 1 μm below the surface in the centre of the semiconductor substrate is $5.0\times10^{16}$ atoms/cm$^3$ or less, the concentration of oxygen at the centre of the thickness of the semiconductor substrate is $8.5\times10^{17}$ atoms/cm$^3$ or less, the density of the crystal defect of oxygen precipitates at the centre of the thickness of the semiconductor substrate is $5\times10^8/cm^3$ or more and the depth of the denuded zone of the void type defect is larger than 12 μm, and is provided with a locally densified portion produced by nitrogen segregation and exhibiting a signal strength two or more times the average signal strength at the depth of 12 μm or more below the surface thereof, when measuring the concentration of nitrogen by secondary ion mass-spectroscopy. The fact that the depth of this locally densified portion is 12 μm or more is necessary factor for Claim 4.

Moreover, the present invention comprises heat-treating, for at least one hour (advantageously 1 to 2 hours, 3 or less hours are desirable in view of productivity) at the temperature of 1200° C. (industrially practicable at the temperature of up to about 1300° C.) or more in a non-oxidising atmosphere, a silicon semiconductor substrate, having an oxygen concentration of $9.5\times10^{17}$ atoms/cm$^3$ or less and a nitrogen concentration of $5\times10^{14}$ atoms/cm$^3$ or more and $1\times10^{16}$ atoms/cm$^3$ or less (at this time, the maximum signal strength measured by infrared interference method is 2 V or less) and obtained from a silicon single crystal grown by using a silicon melt containing $5\times10^{17}$ atoms/cm$^3$ or more and $1.5\times10^{19}$ atoms/cm$^3$ or less of nitrogen by Czochralski method or magnetic field-applied Czochralski method at the cooling rate of 5° C./minute or more at the temperature of 1100° C. This production process ensures that a silicon single crystal semiconductor substrate is produced in which the concentration of oxygen at the depth of 1 μm below the surface in the centre of the semiconductor substrate is $5.0\times10^{16}$ atoms/cm$^3$ or less, the concentration of oxygen at the centre of the thickness of the semiconductor substrate is $9.5\times10^{17}$ atoms/cm$^3$, the depth of the denuded zone is larger than 12 μm and the density of the crystal defect of oxygen precipitates at the centre of the thickness of the semiconductor substrate is $5\times10^8/cm^3$ or more.

Also, the present invention comprises heat-treating, for at least one hour at the temperature of 1200° C. or more in a non-oxidising atmosphere, a silicon semiconductor substrate, having an oxygen concentration of $9.5\times10^{17}$ atoms/cm$^3$ or less and a nitrogen concentration of $2\times10^{14}$ atoms/cm$^3$ or more and $1\times10^{16}$ atoms/cm$^3$ or less (at this time, the maximum signal strength measured at the centre of the semiconductor substrate by infrared interference method is 4 V or less) and obtained from a silicon single crystal grown by using a silicon melt containing $2\times10^{17}$ atoms/cm$^3$ or more and $1.5\times10^{19}$ atoms/cm$^3$ or less of nitrogen by Czochralski method or magnetic field-applied Czochralski method at the cooling rate of 5° C./minute or more at the temperature of 1100° C. This production process ensures that a silicon single crystal semiconductor substrate is produced in which the concentration of oxygen at the depth of 1 μm below the surface in the centre of the semiconductor substrate is $5\times10^{16}$ atoms/cm$^3$ or less, the concentration of oxygen at the centre of the thickness of the semiconductor substrate is $9.5\times10^{17}$ atoms/cm$^3$ or less, a locally densified portion is provided which is produced by nitrogen segregation and exhibiting a signal strength two or more times the average signal strength at the depth of 12 μm or more below the surface thereof when measuring the concentration of nitrogen by secondary ion mass-spectroscopy (SIMS), the depth of the denuded zone of the void type defect is 12 μm or more and the crystal defect density of oxygen precipitates at the centre of the thickness thereof is $5 \times 10^8/cm^3$ or more.

Also, the present invention comprises heat-treating, for at least one hour at the temperature of 1200° C. or more, a silicon semiconductor substrate, having an oxygen concentration of $8.5 \times 10^{17}$ atoms/$cm^3$ or less and a nitrogen concentration of $1 \times 10^{15}$ atoms/$cm^3$ or more and $1 \times 10^{16}$ atoms/$cm^3$ or less (at this time, the maximum signal strength measured at the centre of the semiconductor substrate by infrared interference method is 7 V or less) and obtained from a silicon single crystal grown by using a silicon melt containing $1 \times 10^{18}$ atoms/$cm^3$ or more and $1.5 \times 10^{19}$ atoms/$cm^3$ or less of nitrogen by Czochralski method or magnetic field-applied Czochralski method at the cooling rate of 1° C./min or more and less than 5° C./minute at the temperature of 1100° C.

Also in this case, a low cooling rate at the temperature of 1100° C., a rate as low as 1° C./min or more and less than 5° C./min, is selected. Therefore, the lower limit of the nitrogen content is made higher than in the case where the cooling rate is high, to prevent the enlargement of the void type defect. As for the upper limit, $1 \times 10^{16}$ atoms/$cm^3$ is selected, as mentioned above, to avoid the polycrystallisation in the course of pulling up the single crystal.

This production process ensures that a silicon semiconductor substrate is produced in which the concentration of oxygen at the depth of 1 μm below the surface in the centre of the semiconductor substrate is $5 \times 10^{16}$ atoms/$cm^3$ or less, the concentration of oxygen at the centre of the thickness of the semiconductor substrate is $8.5 \times 10^{17}$ atoms/$cm^3$ or less, the crystal defect density of oxygen precipitates at the centre of the thickness thereof is $5 \times 10^{18}/cm^3$ or more, a locally densified portion is provided which is produced by nitrogen segregation and exhibits a signal strength two or more times the average signal strength at the depth of 12 μm or more below the surface thereof when measuring the concentration of nitrogen by secondary ion mass-spectroscopy and the depth of the denuded zone of the void type defect is 12 μm or more.

PREFERRED EMBODIMENTS OF THE INVENTION

In the present invention, a silicon single crystal is grown by Czochralski method or magnetic field-applied Czochralski method.

In the Czochralski method, a silicon raw material stored in a quartz crucible disposed on a pedestal of a rotating axis is heated and melted by a heater surrounding the crucible, a seed crystal is brought into contact with the surface of the silicon melt from the above while rotating the seed crystal and then the seed crystal is pulled up while rotating it to grow a single crystal. In this method, the rotation symmetry of the distribution of temperature in the vicinity of the boundary of crystal growth is improved by the rotations of both melt and single crystal.

The magnetic field-applied Czochralski method is a Czochralski method where the convection in the melt is restrained by applying a magnetic field to the silicon melt. Examples of the method for applying a magnetic field to the silicon solution include horizontal magnetic field-applying method, vertical magnetic field-applying method, and cusp magnetic field-applying method, where both horizontal and vertical magnetic fields are applied. In the horizontal magnetic field-applying method, the horizontal magnetic field is applied asymmetrically to the inside of the melt. So the effect of restraining the convection becomes also asymmetric and the concentration of impurities regularly fluctuates synchronously with the period of rotation and the concentration of interstitial oxygen in the crystal fluctuates. It is therefore necessary to restrict them. In the vertical magnetic field-applying method, the asymmetric magnetic field problem in the horizontal magnetic field-applying method is solved and a rotationally symmetric vertical magnetic field is applied making the distribution of temperature rotationally symmetric. However, the vertical flow causes the oxygen dissolved in the melt to reach the growth boundary and to be incorporated into the single crystal. So, measures must be taken to avoid these phenomena. On the contrary, the cusp magnetic field-applying method, using both horizontal and vertical magnetic fields, is practised by allowing two solenoids to face each other and flowing each current in reverse directions so that each magnetic field is directed towards the other solenoid. Therefore, this method has the advantages of both the horizontal magnetic field-applying method and the vertical magnetic field-applying method.

In the present invention, the concentration of nitrogen in the melt of a polycrystalline silicon raw material in a crucible when growing a silicon single crystal by the Czochralski method or the magnetic field-applied Czochralski method can be adjusted to various values by regulating the nitrogen concentration in atmospheric gas containing nitrogen and by selecting the number of poured silicon wafers with silicon nitride film.

In the present invention, a semiconductor substrate sliced from a silicon single crystal ingot grown by the Czochralski method or the magnetic field-applied Czochralski method is heat-treated for at least one hour at the temperature of at least 1200° C. in an atmosphere of hydrogen, argon, nitrogen or a mixture of these gases.

In the following examples and comparative examples, the heating rate during the heat-treatment in a temperature range of between 1100° C. and 1200° C. was set to 1° C./min. In the examples, the case of heat-treating for one hour at the temperature of 1200° C. and the case of heat-treating for two hours at the temperature of 1200° C. are shown. The case of heat-treating for 2 hours at the temperature of 1200° C. is shown for the purpose of taking a total wafer retention time sufficiently at the temperature of 1100° C. or more, in consideration of the case where the heating rate between 1100° C. to 1200° C. is high. Therefore, when the heating rate is made low for slip-control measures and the like, the treating time of one hour is enough for the heat-treatment at the temperature of 1200° C. to obtain a semiconductor substrate having the quality targeted in the present invention.

In the present invention, the denuded zone of the void type defect means the depth from the surface of a semiconductor substrate when the acceptable density is designed to be $2 \times 10^5$ or less in terms of density of a COP (Crystal Originated Particle) with the size of 0.1 μm or more which appears by repeated cleaning using SC1. The denuded zone means a depth of defect free zone from the surface of a semiconductor substrate, at which the yield of gate oxide judgment within the range of over 11 MV/cm at current density of 100 mA/cm2 (we call this yield High C mode yield) at 20 mm2 area deposited 20 nm thin gate oxide is 90% or more. We use this more than 90% yield the standard of judgment of GOI in this invention.

In the present invention, the depth of the denuded zone is evaluated the maximum depth both by the evaluation of repeated cleaning using SC1 for the void type defect and by the evaluation of GOI for the void and more small defect. If the results of GOI are more than 90% yield, the results of repeated cleaning using SC1 are less than $2 \times 10^5/cm^3$ .but Converses do not always consist.

The density of the crystal defect of oxygen precipitates, expressed as BMD (Bulk Microdefect) density, means the density of micro-defects caused by $SiO_2$ resulting from the precipitation of heat-treated interstitial oxygen solved as a supersaturated solid solution in a silicon single crystal and micro-defects resulting from a dislocation caused by a stacking fault along with the formation of $SiO_2$, and is a value measured by an MO4 (BMD analyser).

EXAMPLES

Next, the present invention will be explained in detail by way of examples with reference to comparative examples.

In the present invention, a concentration of $2 \times 10^{17}$ atoms/$cm^3$ or more and $1.5 \times 10^{19}$ atoms/$cm^3$ or less is selected as the nitrogen concentration in the silicon melt when growing the single crystal at the cooling rate of 5° C./min at the temperature of 1100° C. when pulling up the silicon single crystal by Czochralski method or magnetic field-applied Czochralski method.

On the other hand, in the case where the cooling rate is 1° C./min or more and less than 5° C./min at the temperature of 1100° C., the concentration of $1 \times 10^{18}$ atoms/$cm^3$ or more and $1.5 \times 10^{19}$ atoms/$cm^3$ or less is selected as the nitrogen concentration in the silicon melt.

Silicon single crystal ingots grown in the above condition and silicon single crystal ingots grown from a melt containing no nitrogen are shown in Table 1.

In Table 1, the first column shows the type of ingot. In this column, the term (c) means the ingot used in comparative example, the term (e) means the ingot used in example and the term (e, c) means the ingot used in both example and comparative example. The second column shows the concentration of nitrogen in the silicon melt, the third column shows the cooling rate at the temperature of 1100° C. in the course of pulling up the silicon single crystal, the fourth column shows the concentration of oxygen in the grown silicon single crystal ingot, the fifth column shows the pulling-up rate of the silicon single crystal and the sixth column indicates the diameter of the silicon single crystal ingot.

TABLE 1

| Ingot | Nitrogen concentration in silicon melt (atoms/$cm^3$) | Cooling rate (° C./min) | Oxygen concentration (atoms/$cm^3$) | Average pulling-up rate (mm/min) | Ingot diameter (mm) |
|---|---|---|---|---|---|
| A (c) | $5 \times 10^{17}$ | 11 | $8.5–10 \times 10^{17}$ | 2.2 | 150 |
| B (e) | $5 \times 10^{17}$ | 11 | $7.5–8.5 \times 10^{17}$ | 2.2 | 150 |
| C (e) | $5 \times 10^{17}$ | 7 | $7–9 \times 10^{17}$ | 1.8 | 150 |
| D (e) | $5 \times 10^{17}$ | 2.5 | $6.5–7.5 \times 10^{17}$ | 1.8 | 150 |
| E (c) | $5 \times 10^{17}$ | 4.5 | $7.5–9 \times 10^{17}$ | 1.4 | 200 |
| F (c) | $5 \times 10^{17}$ | 2.5 | $7.5–9 \times 10^{17}$ | 1.1 | 200 |
| G (e) | $1 \times 10^{18}$ | 4.5 | $7.5–9 \times 10^{17}$ | 1.4 | 200 |
| H (e) | $1 \times 10^{18}$ | 2.5 | $7.5–9 \times 10^{17}$ | 1.1 | 200 |
| I (c) | $1 \times 10^{18}$ | 11 | $8.5–9.5 \times 10^{17}$ | 2.2 | 150 |
| J (c) | $1 \times 10^{18}$ | 7 | $8–9 \times 10^{17}$ | 1.8 | 150 |
| K (c) | $1.5 \times 10^{18}$ | 11 | $8.5–9.5 \times 10^{17}$ | 2.2 | 150 |
| L (c) | $1.5 \times 10^{18}$ | 7 | $8–9 \times 10^{17}$ | 1.8 | 150 |
| M (c) | $2 \times 10^{18}$ | 11 | $8.5–9.5 \times 10^{17}$ | 2.2 | 150 |
| N (c) | 0 | 11 | $8.5–9.5 \times 10^{17}$ | 2.2 | 150 |
| O (c) | $5 \times 10^{17}$ | 1.3 | $8.5–9.5 \times 10^{17}$ | 1 | 150 |
| P (e) | $2, 5 \times 10^{17}$ | 6 | $8.5–9.5 \times 10^{17}$ | 1 | 150 |
| Q (c) | $1 \times 10^{18}$ | 4.5 | $8.5–9 \times 10^{17}$ | 1.4 | 200 |
| R (c) | $1 \times 10^{18}$ | 2.5 | $8.5–9 \times 10^{17}$ | 1.1 | 200 |
| S (c) | $1.3 \times 10^{17}$ | 11 | $8.5–9 \times 10^{17}$ | 2.2 | 150 |
| T (c) | 0 | 7 | $8.5–9.8 \times 10^{17}$ | 1.8 | 150 |

Next, examples shown in Table 2, which are the results of heat-treating a semiconductor substrate sliced from a silicon single crystal ingot pulled up at the cooling rate of 5° C./min or more at the temperature of 1100° C., will be explained.

TABLE 2

| Example | Ingot | Nitrogen concentration (atoms/$cm^3$) | Oxygen concentration (atoms/$cm^3$) | Cooling rate during pulling up (° C./min) | OPP signal strength (V) | Heat treatment temperature × time (° C. × h) | Oxygen concentration at a depth of 1 $\mu m$ (atoms/$cm^3$) | Depth of a denuded zone of a void type defect ($\mu m$) | Depth of a denuded zone by GOI evaluation ($\mu m$) | BMD density (1/$cm^3$) | N spike depth ($\mu m$) |
|---|---|---|---|---|---|---|---|---|---|---|---|
| 1 | B | $7 \times 10^{14}$ | $8.5 \times 10^{17}$ | 11 | 1.995 | 1200 × 2 | $3.2 \times 10^{16}$ | 12.5 | 12.5 | $>1 \times 10^9$ | 13.4 |
| 2 | B | $14 \times 10^{14}$ | $7.6 \times 10^{17}$ | 11 | 0.794 | 1200 × 1 | $4 \times 10^{16}$ | 12.5 | 12.5 | $>1 \times 10^9$ | 12.8 |
| 3 | C | $11 \times 10^{14}$ | $9 \times 10^{17}$ | 7 | 1.586 | 1200 × 2 | $3.4 \times 10^{16}$ | 12.5 | 12.5 | $>1 \times 10^9$ | 13.4 |
| 4 | I | $20 \times 10^{14}$ | $9.2 \times 10^{17}$ | 11 | 0.316 | 1200 × 2 | $3.5 \times 10^{16}$ | 12.5 | 12.5 | $>1 \times 10^9$ | 13.4 |
| 5 | J | $30 \times 10^{14}$ | $8.7 \times 10^{17}$ | 7 | 1.26 | 1200 × 2 | $3.3 \times 10^{16}$ | 12.5 | 12.5 | $>1 \times 10^9$ | 13.4 |
| 6 | K | $26 \times 10^{14}$ | $9 \times 10^{17}$ | 11 | 1.0 | 1200 × 2 | $3.4 \times 10^{16}$ | 12.5 | 12.5 | $>1 \times 10^9$ | 13.4 |

Example 1

A semiconductor substrate sliced from ingot B shown in Table 1 was used. Therefore, the ingot was pulled up from the melt having a nitrogen concentration of $5 \times 10^{17}$ atoms/cm$^3$ at the cooling rate of 11° C./min at the temperature of 1100° C. The rotation of the crystal and the rotation of the crucible were controlled so that the concentration of oxygen in the cylindrical section of the ingot would be 7.5 to $8.5 \times 10^{17}$ atoms/cm$^3$. Among semiconductor substrates processed from the ingot, a semiconductor substrate having a nitrogen concentration of $7 \times 10^{14}$ atoms/cm$^3$, an oxygen concentration of $8.5 \times 10^{17}$ atoms/cm$^3$ and the maximum signal strength of 1.995 V when measuring the microdefects at the centre of the semiconductor substrate by infrared interference method (OPP) was selected and heat-treated for 2 hours at the temperature of 1200° C. in an atmosphere consisting of a mixture of 50% hydrogen and 50% argon. As a result, the depth of the denuded zone of the void type defect and the depth of denuded zone by GOI evaluation in the semiconductor substrate were both 12.5 µm, the oxygen concentration at the centre of the thickness of the semiconductor substrate was $8.5 \times 10^{17}$ atoms/cm$^3$ or less, the BMD density was $1 \times 10^9$/cm$^3$ or more, the oxygen concentration at the depth of 1 µm below the surface in the centre of the semiconductor substrate was $3.2 \times 10^{16}$ atoms/cm$^3$ and the nitrogen spike (N spike) depth was 13.4 µm. The N spike depth of 13.4 µm means that the locally densified portion produced by nitrogen segregation and exhibiting a signal strength two or more times the average signal strength begins to arise from the depth of 13.4 µm below the surface of the semiconductor substrate when measuring the concentration of nitrogen by secondary ion mass-spectroscopy (SIMS). Therefore, in the semiconductor substrate after heat-treatment, the depth of the denuded zone of the void type defect and the depth of denuded zone by GOI evaluation are both 12.5 µm and therefore the depth of the denuded zone is at least 12.5 µm. The term "at least" means that the actual value of polishing was 12.5 µm in the example and that the denuded zone may possibly be extended to a deeper region. Therefore, the depth of the denuded zone is much deeper than 12 µm and the depth of the layer region applicable for the production of semiconductor devices is extended by as much as 0.5 µm, thereby increasing the freedom for the production of semiconductor devices.

Example 2

A semiconductor substrate similarly sliced from ingot B shown in Table 1 was used, but a semiconductor substrate, having a nitrogen concentration of $1.4 \times 10^{15}$ atoms/cm$^3$, an oxygen concentration of $7.6 \times 10^{17}$ atoms/cm$^3$ and the maximum signal strength of 0.794 V when measuring the microdefects at the centre of the semiconductor substrate by infrared interference method (OPP), was used and heat-treated for 1 hour at the temperature of 1200° C. in an atmosphere consisting of a mixture of 50% hydrogen and 50% argon. As a result, the depth of the denuded zone of the void type defect and the depth of denuded zone by GOI evaluation were both 12.5 µm, the oxygen concentration at the centre of the thickness of the semiconductor substrate was $7.6 \times 10^{17}$ atoms/cm$^3$ or less, the BMD density was $1 \times 10^9$/cm$^3$ or more, the oxygen concentration at the depth of 1 µm below the surface in the centre of the semiconductor substrate was $4 \times 10^{16}$ atoms/cm$^3$ and the N spike depth was 12.8 µm. Although the N spike depth was lower than that of Example 1 by 0.6 µm, this is within a range of a measurement error.

Example 3

A semiconductor substrate sliced from ingot C shown in Table 1 was used. Therefore, the ingot was pulled up from the melt having a nitrogen concentration of $5 \times 10^{17}$ atoms/cm$^3$ at the cooling rate of 7° C./min at the temperature of 1100° C. The rotation of the crystal and the rotation of the crucible were controlled so that the concentration of oxygen in the cylindrical section of the ingot would be 7.0 to $9.0 \times 10^{17}$ atoms/cm$^3$. The sliced semiconductor substrate, having an oxygen concentration of $9 \times 10^{17}$ atoms/cm$^3$, a nitrogen concentration of $11 \times 10^{14}$ atoms/cm$^3$ and a maximum signal strength of 1.585 V when measured at the centre of the semiconductor substrate by infrared interference method (OPP), was heat-treated for 2 hours at the temperature of 1200° C. in an atmosphere consisting of a mixture of 10% hydrogen and 90% argon. As a result, the of the denuded zone depth of the void type defect and the depth of denuded zone by GOI evaluation were both 12.5 µm, the oxygen concentration at the centre of the thickness of the semiconductor substrate was $9 \times 10^{17}$ atoms/cm$^3$ or less, the BMD density was $1 \times 10^9$/cm$^3$ or more, the oxygen concentration at the depth of 1 µm below the surface in the centre of the semiconductor substrate was $3.4 \times 10^{16}$ atoms/cm$^3$ and the N spike depth was 13.4 µm.

Example 4

A semiconductor substrate, sliced from ingot I shown in Table 1 and having an oxygen concentration of $9.2 \times 10^{17}$ atoms/cm$^3$, a nitrogen concentration of $2 \times 10^{15}$ atoms/cm$^3$ and the maximum signal strength of 0.316 V when measured at the centre of the semiconductor substrate by infrared interference method (OPP), was heat-treated for 2 hours at the temperature of 1200° C. in an atmosphere consisting of a mixture of 10% hydrogen and 90% argon. As a result, the depth of the denuded zone of the void type defect and the depth of denuded zone by GOI evaluation in the semiconductor substrate were both 12.5 µm, and therefore, the depth of the denuded zone was 12.5 µm, the oxygen concentration at the centre of the semiconductor substrate was $9.2 \times 10^{17}$ atoms/cm$^3$ or less, the BMD density was $1 \times 10^{19}$/cm$^3$ or more, the oxygen concentration at the depth of 1 µm below the surface in the centre of the semiconductor substrate was $3.5 \times 10^{16}$ atoms/cm$^3$ and the N spike depth was 13.4 µm.

Examples 5 and 6

In Example 5, a semiconductor substrate, sliced from ingot J shown in Table 1 and having a nitrogen concentration of $3 \times 10^{15}$ atoms/cm$^3$, an oxygen concentration of $8.7 \times 10^{17}$ atoms/cm$^3$ and the maximum signal strength of 1.26 V when measured at the centre of the semiconductor substrate by infrared interference method (OPP), was used. In Example 6, a semiconductor substrate, sliced from ingot K shown in Table 1 and having a nitrogen concentration of $2.6 \times 10^{15}$ atoms/cm$^3$, an oxygen concentration of $9 \times 10^{17}$ atoms/cm$^3$ and a maximum signal strength of 1.0 V when measured at the centre of the semiconductor substrate by infrared interference method (OPP), was used. Each substrate was heat-treated for 2 hours at the temperature of 1200° C. in an atmosphere consisting of 100% argon. As a result, the oxygen concentration at the depth of 1 µm below the surface in the centre of the semiconductor substrate was $3.3 \times 10^{16}$ atoms/cm$^3$ or $3.4 \times 10^{16}$ atoms/cm$^3$, the depth of the denuded zone of the void type defect and the depth of denuded zone by GOI evaluation were both 12.5 µm, and therefore, the depth of the denuded zone (ZD) was 12.5 µm, the oxygen concentration at the centre of the thickness of the semiconductor substrate was $8.7 \times 10^{17}$ atoms/cm$^3$ or less or $8.9 \times 10^{17}$ atoms/cm$^3$ or less, the BMD density was $1 \times 10^9$/cm$^3$ or more and the N spike depth was 13.4 μm.

As is clear from the above examples, a semiconductor substrate, having a nitrogen concentration of $5 \times 10^{14}$ atoms/cm$^3$ or more and $1 \times 10^{16}$ atoms/cm$^3$ or less, an oxygen concentration of $9.5 \times 10^{17}$ atoms/cm$^3$ or less and a maximum signal strength of 2 V or less when measured at the centre of the semiconductor substrate by infrared interference method (OPP), which is sliced from a silicon single crystal ingot obtained by adjusting the nitrogen concentration of the melt to $5 \times 10^{17}$ atoms/cm$^3$ or more and $1.5 \times 10^{19}$ atoms/cm$^3$ or less and by pulling up the ingot while controlling the cooling rate at 5° C./min or more at the temperature of 1100° C. by the Czochralski method or the magnetic field-applied Czochralski method, is heat-treated for at least one hour at the temperature of 1200° C. or more in a non-oxidising atmosphere. The depth of the denuded zone can be made much deeper than 12 μm, and a silicon semiconductor substrate in which the crystal defect density of oxygen precipitates at the centre of the thickness thereof is $5 \times 10^8$/cm$^3$ or more, can be obtained.

Next, the cases where heat-treatment was carried out by using a semiconductor substrate which was sliced from an ingot pulled up at the cooling rate of 5° C./min or more at the temperature of 1100° C. when growing the silicon single crystal, but having a nitrogen concentration and an oxygen concentration out of the ranges defined by the invention are shown as comparative examples (see Table 3).

depth of denuded zone by GOI evaluation was 7 μm, the BMD density was $5 \times 10^8$/cm$^3$ or more, the oxygen concentration at the centre of the thickness of the semiconductor substrate was $9.3 \times 10^{17}$ atoms/cm$^3$ or less. Due to the lack of nitrogen, no N spike occurred. The depth of the denuded zone of the semiconductor substrate is only 7 μm and even considering only the depth of the denuded zone of the void type defect, a substrate having the depth as low as 7 μm can be obtained. This is because the nitrogen concentration in the melt and in the semiconductor substrate is zero and the OPP signal strength is too high.

Comparative Example 2

A semiconductor substrate, sliced from ingot 0 shown in Table 1 and grown at the cooling rate of 1.5° C./min at the temperature of 1100° C. when pulling up the single crystal and having an nitrogen concentration of $6.6 \times 10^{14}$ atoms/cm$^3$, an oxygen concentration of $9.1 \times 10^{17}$ atoms/cm$^3$ and an OPP signal strength of 6.31 V, was heat-treated for 2 hours at the temperature of 1200° C. in an atmosphere consisting of 25% hydrogen and 75% argon. As a result, the oxygen concentration at the depth of 1 μm of the semiconductor substrate was $3.6 \times 10^{16}$ atoms/cm$^3$, the depth of the denuded zone of the void type defect was 7 μm and the depth of denuded zone by GOI evaluation was 7 μm, the BMD density was $1 \times 10^{19}$/cm$^3$ or more and the oxygen concentration at the centre of the thickness of the semiconductor substrate was $9.1 \times 10^{17}$ atoms/cm$^3$ or less. In this case also, the depth of the denuded zone of the void type defect and the

TABLE 3

| Comparative Example | Ingot | Nitrogen concentration (atoms/cm$^3$) | Oxygen concentration (atoms/cm$^3$) | Cooling rate during pulling-up (° C./min) | OPP signal strength (V) | Heat treatment temperature × time (° C. × h) | Oxygen concentration at a depth of 1 μm (atoms/cm$^3$) | Depth of a denuded zone of a void type defect (μm) | Depth of a denuded zone by GOI evaluation (μm) | BMD density (1/cm$^3$) | N spike depth (μm) |
|---|---|---|---|---|---|---|---|---|---|---|---|
| 1 | T | 0 | $9.3 \times 10^{17}$ | 11 | 5.0 | 1200 × 2 | $3.6 \times 10^{16}$ | 7 | 7 | $>5 \times 10^8$ | spike not found |
| 2 | O | $6.6 \times 10^{14}$ | $9.1 \times 10^{17}$ | 1.5 | 6.31 | 1200 × 2 | $3.6 \times 10^{16}$ | 7 | 7 | $>1 \times 10^9$ | 13.4 |
| 3 | O | $9.8 \times 10^{14}$ | $9.1 \times 10^{17}$ | 1.5 | 10 | 1200 × 2 | $3.6 \times 10^{16}$ | 10 | 8 | $>1 \times 10^9$ | 13.4 |
| 4 | A | $8.3 \times 10^{14}$ | $9.8 \times 10^{17}$ | 11 | 0.794 | 1200 × 2 | $3.7 \times 10^{16}$ | 8 | 8 | $>1 \times 10^9$ | 13.4 |
| 5 | A | $11 \times 10^{14}$ | $9.6 \times 10^{17}$ | 11 | 0.301 | 1200 × 2 | $3.6 \times 10^{16}$ | 8 | 8 | $>1 \times 10^9$ | 13.4 |
| 6 | S | $1.2 \times 10^{14}$ | $8.6 \times 10^{17}$ | 11 | 1.26 | 1200 × 2 | $3.2 \times 10^{16}$ | 8 | 8 | $>5 \times 10^8$ | 13.4 |
| 7 | B | $7.2 \times 10^{14}$ | $8.5 \times 10^{17}$ | 11 | 1.995 | 1150 × 4 | $3.2 \times 10^{16}$ | 8 | 6 | $>1 \times 10^9$ | 8 |
| 8 | I | $24 \times 10^{14}$ | $9.1 \times 10^{17}$ | 11 | 0.50 | 1150 × 4 | $3.4 \times 10^{16}$ | 8 | 6 | $>1 \times 10^9$ | 8 |
| 9 | K | $25 \times 10^{14}$ | $8.6 \times 10^{17}$ | 11 | 1.0 | 1150 × 4 | $3.2 \times 10^{16}$ | 8 | 6 | $>1 \times 10^9$ | 8 |
| 10 | L | $25 \times 10^{14}$ | $8.2 \times 10^{17}$ | 7 | 0.398 | 1150 × 4 | $3 \times 10^{16}$ | 8 | 6 | $>1 \times 10^9$ | 8 |

Comparative Example 1

A semiconductor substrate, sliced from ingot I shown in Table 1 and having an nitrogen concentration of 0, an oxygen concentration of $9.3 \times 10^{17}$ atoms/cm$^3$ and the maximum signal strength of 5.0 V when measured at the centre of the semiconductor substrate by infrared interference method, (hereinafter abbreviated as OPP signal strength), was heat-treated for 2 hours at the temperature of 1200° C. in an atmosphere consisting of 25% hydrogen and 75% argon. As a result, the oxygen concentration at the depth of 1 μm below the surface in the centre of the semiconductor substrate (hereinafter abbreviated as oxygen concentration at the depth of 1 μm) was $3.6 \times 10^{16}$ atoms/cm$^3$, the depth of the denuded zone of the void type defect was 7 μm and the depth of denuded zone by GOI evaluation are both as low as 7 μm. This is considered to be because the cooling rate at the temperature of 1100° C. when pulling up the silicon single crystal is 1.5° C./min, which is lower than 5° C./min, and the OPP signal strength of the semiconductor substrate before heat-treated is higher than 2 V to 4 V.

Comparative Example 3

A semiconductor substrate, sliced from ingot 0 shown in Table 1 and grown at the cooling rate of 1.5° C./min at the temperature of 1100° C. when pulling up the single crystal and having a nitrogen concentration of $9.8 \times 10^{14}$ atoms/cm$^3$, an oxygen concentration of $9.1 \times 10^{17}$ atoms/cm$^3$ and an OPP signal strength of 10 V, was heat-treated for 2 hours at the temperature of 1200° C. in the same atmosphere as in Comparative Example 1. As a result, the oxygen concentration at the depth of 1 μm of the semiconductor substrate was $3.6 \times 10^{16}$ atoms/cm$^3$, the depth of the denuded zone of the void type defect was 10 μm and the depth of denuded zone by GOI evaluation was 8 μm, the BMD density was $1 \times 10^9$/cm$^3$ or more, the N spike depth was 13.4 μm and the oxygen concentration at the centre of the thickness of the semiconductor substrate was $9.1 \times 10^{17}$ atoms/cm$^3$ or less. In this case also, the depth of the void type defect and the depth of the denuded zone by GOI evaluation are both as low as 10 μm. This is considered to be because the cooling rate is low and the OPP signal strength is high as in Comparative Example 2.

Comparative Example 4

A semiconductor substrate, sliced from ingot A shown in Table 1 and having a nitrogen concentration of $8.3 \times 10^{14}$ atoms/cm$^3$, an oxygen concentration of $9.8 \times 10^{17}$ atoms/cm$^3$ and an OPP signal strength of 0.794 V, was heat-treated for 2 hours at the temperature of 1200° C. in an atmosphere consisting of 25% hydrogen and 75% argon. As a result, the oxygen concentration at the depth of 1 μm was $3.7 \times 10^{16}$ atoms/cm$^3$, the depth of the denuded zone of the void type defect was 8 μm and the depth of denuded zone by GOI evaluation was 8 μm, and the depth of the denuded zone did not reach 10 μm in the same manner as in Comparative Example 1. The BMD density was $1 \times 10^9$/cm$^3$ or more, the N spike depth was 13.4 μm and the oxygen concentration at the centre of the thickness of the semiconductor substrate was $9.8 \times 10^{17}$ atoms/cm$^3$ or less. In this comparative example also, the reason why the depth of the denuded zone was low, though the heat-treating condition was the same as in Example 1, is considered to be that the oxygen concentration in the silicon semiconductor substrate was 9.8 atoms/cm$^3$, which is higher than 9.5 atoms/cm$^3$.

Comparative Example 5

A semiconductor substrate sliced from ingot A was used in the same manner as in Comparative Example 4. This comparative example differs from Comparative Example 4 only in the point that the nitrogen concentration was $1.1 \times 10^{15}$ atoms/cm$^3$, the oxygen concentration was $9.6 \times 10^{17}$ atoms/cm$^3$ and the OPP signal strength was 0.301 V, and the atmospheric gas and other heat-treating conditions were the same as in Comparative Example 4. As a result, the oxygen concentration at the depth of 1 μm was $3.6 \times 10^{16}$ atoms/cm$^3$, the depth of the denuded zone of the void type defect was 8 μm, the depth of denuded zone by GOI evaluation was 8 μm, the BMD density was $1 \times 10^9$/cm$^3$ or more, and the N spike depth, as in Comparative Example 2, was 13.4 μm. The reason why the value of the depth of the denuded zone of the void type defect and the value of the depth of denuded zone by GOI evaluation is low is considered to be because the oxygen concentration is higher than 9.5 atoms/cm$^3$.

Comparative Example 6

A semiconductor substrate, sliced from ingot S shown in Table 1 and having a nitrogen concentration of $1.2 \times 10^{14}$ atoms/cm$^3$, an oxygen concentration of $8.6 \times 10^{17}$ atoms/cm$^3$ and an OPP signal strength of 1.26 V, was heat-treated for 2 hours at the temperature of 1200° C. in an atmosphere consisting of 25 hydrogen and 75 argon. As a result, the oxygen concentration at the depth of 1 μm was $3.2 \times 10^{16}$ atoms/cm$^3$, the depth of the denuded zone of the void type defect and the depth of denuded zone by GOI evaluation were both as low as 8 μm, the BMD density was $5 \times 10^8$/cm$^3$ or more and the N spike depth was 13.4 μm. The reason why the depth of the denuded zone of the semiconductor substrate is therefore as low as 8 μm is that the nitrogen concentration in the melt is as low as $1.3 \times 10^{17}$ atoms/cm$^3$ and the nitrogen concentration before heat-treatment is below $2 \times 10^{14}$ atoms/cm$^3$.

Comparative Examples 7, 8, 9, and 10

In Comparative Example 7, a semiconductor substrate sliced from ingot B shown in Table 1 and having a nitrogen concentration of $7.2 \times 10^{14}$ atoms/cm$^3$, an oxygen concentration of $8.5 \times 10^{17}$ atoms/cm$^3$ and an OPP signal strength of 1.995 V was used.

In Comparative Example 8, a semiconductor substrate sliced from ingot I shown in Table 1 and having a nitrogen concentration of $2.4 \times 10^{15}$ atoms/cm$^3$, an oxygen concentration of $9.1 \times 10^{17}$ atoms/cm$^3$ and an OPP signal strength of 0.50 V was used.

In Comparative Example 9, a semiconductor substrate sliced from ingot K shown in Table 1 and having a nitrogen concentration of $2.5 \times 10^{15}$ atoms/cm$^3$, an oxygen concentration of $8.6 \times 10^{17}$ atoms/cm$^3$ and an OPP signal strength of 1.0 V was used.

In Comparative Example 10, a semiconductor substrate sliced from ingot L shown in Table 1 and having a nitrogen concentration of $2.5 \times 10^{15}$ atoms/cm$^3$, an oxygen concentration of $8.2 \times 10^{17}$ atoms/cm$^3$ and an OPP signal strength of 0.398 V was used. All of these semiconductor substrates were heat-treated for 4 hours at the temperature of 1150° C. in an argon atmosphere. As a result, in all of these comparative examples, the depth of denuded zone of void type defect was 8 μm, the depth of denuded zone by GOI evaluation was 6 μm, the BMD density was $1 \times 10^9$ or more, the N spike depth was 8 μm and the oxygen concentration at the depth of 1 μm was 3 to 3.4 atoms/cm$^3$. In these comparative examples, the depth of the denuded zone of the void type defect and the depth of denuded zone by GOI evaluation are both as low as 10 μm though the heat-treatment was carried out for as long as 4 hours. This is considered to be because the heat-treating temperature is 1150° C., which is lower than 1200° C.

Next, explanations will be given referring to Table 4 concerning examples of heat-treating a semiconductor substrate having an oxygen concentration of $9.5 \times 10^{17}$ atoms/cm$^3$ or less and a nitrogen concentration of $2 \times 10^{14}$ atoms/cm$^3$ or more and $1 \times 10^{16}$ atoms/cm$^3$ or less, which was sliced from a silicon single crystal grown by pulling up at the cooling rate of 5° C./min or more at the temperature of 1100° C. by using a silicon melt containing nitrogen in the amount of $2 \times 10^{17}$ atoms/cm$^3$ or more and $1.5 \times 10^{19}$ atoms/cm$^3$ or less through Czochralski method or magnetic field-applied Czochralski method.

TABLE 4

| Example | Ingot | Nitrogen concentration (atoms/cm$^3$) | Oxygen concentration (atoms/cm$^3$) | Cooling rate during pulling-up (° C./min) | OPP signal strength (V) | Heat treatment temperature × time (° C. × h) | Oxygen concentration at a depth of 1 μm (atoms/cm$^3$) | Depth of a denuded zone of a void type defect (μm) | Depth of a denuded zone by GOI evaluation (μm) | BMD density (1/cm$^3$) | N spike depth (μm) |
|---|---|---|---|---|---|---|---|---|---|---|---|
| 7 | B | 7.1 × 10$^{14}$ | 8.6 × 10$^{17}$ | 11 | 1.995 | 1200 × 1 | 4.4 × 10$^{16}$ | 12.5 | 9 | >1 × 10$^9$ | 12.8 |
| 8 | A | 11 × 10$^{14}$ | 8.9 × 10$^{17}$ | 11 | 1.585 | 1200 × 1 | 4.7 × 10$^{16}$ | 12.5 | 9 | >1 × 10$^9$ | 12.8 |
| 9 | I | 21 × 10$^{14}$ | 9.1 × 10$^{17}$ | 11 | 0.316 | 1200 × 1 | 4.8 × 10$^{16}$ | 12.5 | 9 | >1 × 10$^9$ | 12.8 |
| 10 | J | 31 × 10$^{14}$ | 8.6 × 10$^{17}$ | 7 | 1.26 | 1200 × 1 | 4.6 × 10$^{16}$ | 12.5 | 9 | >1 × 10$^9$ | 12.8 |
| 11 | K | 25 × 10$^{14}$ | 9.1 × 10$^{17}$ | 6 | 1.0 | 1200 × 1 | 4.8 × 10$^{16}$ | 12.5 | 9 | >1 × 10$^9$ | 12.8 |
| 12 | P | 6.1 × 10$^{14}$ | 9.2 × 10$^{17}$ | 11 | 3.16 | 1200 × 1 | 4.9 × 10$^{16}$ | 12.5 | 9 | >1 × 10$^9$ | 12.8 |

Example 7

A semiconductor substrate, sliced from ingot B shown in Table 1 and having a nitrogen concentration of 7.1×10$^{14}$ atoms/cm$^3$, an oxygen concentration of 8.4×10$^{17}$ atoms/cm$^3$ and an OPP signal strength of 1.995 V, was used and heat-treated for 1 hour at the temperature of 1200° C. in an atmosphere consisting of 25% hydrogen and 75% argon. As a result, the oxygen concentration at the depth of 1 μm was 4.4×10$^{16}$ atoms/cm$^3$, the depth of the denuded zone of the void type defect was 12.5 μm, the depth of denuded zone by GOI evaluation was 9 μm, the BMD density was 1×10$^9$/cm$^3$ or more, the N spike depth was 12.8 μm and the oxygen concentration at the centre of the thickness of the semiconductor substrate was 9.5×10$^{17}$ atoms/cm$^3$ or less. In this example, although the depth of the denuded zone of the void type defect is 12.5 μm, which is greater than 12 μm, the depth of denuded zone by GOI evaluation is 9 μm. However, the N spike depth is 12.8 μm. Therefore, a locally densified portion produced by nitrogen segregation and exhibiting a signal strength two or more times the average signal strength in the analysis of nitrogen by secondary ion mass-spectroscopy (SIMS) is located at the depth of 12.8 μm.

Example 8

A semiconductor substrate, sliced from ingot A shown in Table 1 and having a nitrogen concentration of 1.1×10$^{15}$ atoms/cm$^3$, an oxygen concentration of 8.9×10$^{17}$ atoms/cm$^3$ and an OPP signal strength of 1.585 V, was heat-treated for 1 hour at the temperature of 1200° C. in an atmosphere consisting of 25% hydrogen and 75% argon, as in Example 7. As a result, the oxygen concentration at the depth of 1 μm was 4.7×10$^{16}$ atoms/cm$^3$ and the oxygen concentration at the centre of the thickness of the semiconductor substrate was 8.9×10$^{17}$ atoms/cm$^3$ or less. However, the depth of the denuded zone of the void type defect was 12.5 μm, the depth of denuded zone by GOI evaluation was 9 μm, the BMD density was 1×10$^9$/cm$^3$ or more and the N spike depth was 12.8 μm, which are the same as in Example 7. Examples 9, 10, 11, and 12 In Example 9, a semiconductor substrate sliced from ingot I shown in Table 1 and having a nitrogen concentration of 2.1×10$^{15}$ atoms/cm$^3$, an oxygen concentration of 9.1×10$^{17}$ atoms/cm$^3$ and an OPP signal strength of 0.316 V was used. In Example 10, a semiconductor substrate sliced from ingot J shown in Table 1 and having a nitrogen concentration of 3.1×10$^{15}$ atoms/cm$^3$, an oxygen concentration of 8.6×10$^{17}$ atoms/cm$^3$ and an OPP signal strength of 1.26 V was used.

In Example 11, a semiconductor substrate sliced from ingot K shown in Table 1 and having a nitrogen concentration of 2.5×10$^{15}$ atoms/cm$^3$, an oxygen concentration of 9.1×10$^{17}$ atoms/cm$^3$ and an OPP signal strength of 1.585 V was used.

In Example 12, a semiconductor substrate sliced from ingot P shown in Table 1 and having a nitrogen concentration of 6.1×10$^{17}$ atoms/cm$^3$, an oxygen concentration of 9.2×10$^{17}$ atoms/cm$^3$ and an OPP signal strength of 3.16 V was used. The heat-treatment of the semiconductor substrates shown in the above Examples 9 to 12 was carried out for one hour at the temperature of 1200° C. in an atmosphere consisting of 25% hydrogen and 75% argon, as in Example 7. As a result, the depth of the denuded zone of the void type defect, the depth of denuded zone by GOI evaluation, the N spike depth and the BMD density were quite the same as those of Examples 7 and 8. These Examples merely differ from Examples 7 and 8 in the point that the temperature of oxygen at the centre of the thickness of the semiconductor substrate is 8.6 to 9.2×10$^{17}$ atoms/cm$^3$, and the temperature of oxygen at the depth of 1 μm is 4.6 to 4.8×10$^{16}$ atoms/cm$^3$.

The semiconductor substrates shown in the above Examples 7 to 12 are obtained from a silicon single crystals pulled up at the cooling rate of 5° C./min at the temperature of 1100° C. using Czochralski method or magnetic field-applied Czochralski method. Semiconductor substrates having a nitrogen concentration of 2×10$^{14}$ atoms/cm$^3$ or more and 1×10$^{16}$ atoms/cm$^3$ or less, an oxygen concentration of 9.5×10$^{17}$ atoms/cm$^3$ or less and an OPP signal strength of 4 V or less can be obtained. At this time, a silicon melt having a nitrogen concentration ranging from 2×10$^{17}$ atoms/cm$^3$ or more and 1.5×10$^{19}$ atoms/cm$^3$ or less is used and the above semiconductor substrates are obtained as a result of heat-treatment performed at least for one hour at the temperature of 1200° C. or more in a non-oxidising atmosphere.

Comparative Examples 11 to 15 will be, in turn, explained with reference to Table 5.

TABLE 5

| Comparative Example | Ingot | Nitrogen concentration (atoms/cm$^3$) | Oxygen concentration (atoms/cm$^3$) | Cooling rate during pulling-up (° C./min) | OPP signal strength (V) | Heat treatment temperature × time (° C. × h) | Oxygen concentration at a depth of 1 μm (atoms/cm$^3$) | Depth of a denuded zone of a void type defect (μm) | Depth of a denuded zone by GOI evaluation (μm) | BMD density (1/cm$^3$) | N spike depth (μm) |
|---|---|---|---|---|---|---|---|---|---|---|---|
| 11 | N | 0 | 9.3 × 10$^{17}$ | 11 | 5.0 | 1200 × 1 | 4.9 × 10$^{16}$ | 6 | 6 | >5 × 10$^8$ | spike not found |
| 12 | G | 2.5 × 10$^{15}$ | 8.6 × 10$^{17}$ | 4.5 | 1.995 | 1200 × 1 | 4.5 × 10$^{16}$ | 9 | 9 | >1 × 10$^9$ | 12.8 |
| 13 | S | 1.8 × 10$^{14}$ | 9.1 × 10$^{17}$ | 11 | 1.26 | 1200 × 1 | 4.8 × 10$^{16}$ | 10 | 8 | >5 × 10$^8$ | 12.8 |
| 14 | M | 3.8 × 10$^{14}$ | 9.9 × 10$^{17}$ | 11 | 1.26 | 1200 × 1 | 5.2 × 10$^{16}$ | 10 | 6 | >1 × 10$^9$ | 12.8 |
| 15 | C | 8.7 × 10$^{14}$ | 8.8 × 10$^{17}$ | 7 | 1.585 | 1150 × 4 | 3.3 × 10$^{16}$ | 8 | 6 | >1 × 10$^9$ | 8 |

Comparative Examples 11 to 15

In Comparative Example 11, a semiconductor substrate sliced from ingot N shown in Table 1 and having a nitrogen concentration of 0, an oxygen concentration of 9.3 atoms/cm$^3$ and an OPP signal strength of 5.0 V was used.

In Comparative Example 12, a semiconductor substrate sliced from ingot G shown in Table 1 and having a nitrogen concentration of 2.5×10$^{15}$ atoms/cm$^3$, an oxygen concentration of 8.6×10$^{17}$ atoms/cm$^3$ and an OPP signal strength of 1.995 V was used.

In Comparative Example 13, a semiconductor substrate sliced from ingot S shown in Table 1 and having a nitrogen concentration of 1.8×10$^{14}$ atoms/cm$^3$, an oxygen concentration of 9.1×10$^{17}$ atoms/cm$^3$ and an OPP signal strength of 1.26 V was used.

In Comparative Example 14, a semiconductor substrate sliced from ingot M shown in Table 1 and having a nitrogen concentration of 3.8×10$^{15}$ atoms/cm$^3$, an oxygen concentration of 9.9×10$^{17}$ atoms/cm$^3$ and an OPP signal strength of 1.26 V was used.

All semiconductor substrates shown in these comparative examples 11 to 14 were heat-treated for one hour at the temperature of 1200° C. in an atmosphere consisting of 25% hydrogen and 75% argon. As the result of Comparative Example 11, the oxygen concentration at the depth of 1 μm was 4.9×10$^{16}$ atoms/cm$^3$, the depth of the denuded zone of the void type defect and the depth of denuded zone by GOI evaluation were very shallow as low as 6 μm, the BMD density was 5×10$^8$ or more and the N spike was not found. The reason for the decrease in the depth of the denuded zone of the void type defect and the depth of denuded zone by GOI evaluation is considered to be that the nitrogen concentration in the ingot is 0.

As the result of Comparative Example 12, the oxygen concentration at the depth of 1 μm was 4.5×10$^{16}$ atoms/cm$^3$, the depth of the denuded zone of the void type defect was 9 μm, the depth of denuded zone by GOI evaluation was 9 μm, the BMD density was 1×10$^9$ or more and the N spike depth was 12.8 μm. In this case, the depth of the denuded zone of the void defect and the depth of denuded zone by GOI evaluation were made shallow because the pulling rate of the ingot at the temperature of 1100° C. was less than 5° C./min.

In Comparative Example 13 also, the depth of the denuded zone of the void defect and the depth of denuded zone by GOI evaluation are as low as 10 μm and 8 μm respectively. This is considered to be because the nitrogen concentration of the semiconductor substrate before being heat-treated does not satisfy the requirement of the lower limit of 2×10$^{14}$ atoms/cm$^3$.

In Comparative Example 14 also, the depth of the denuded zone of the void defect and the depth of denuded zone by GOI evaluation are as low as 10 μm and 6 μm respectively. This is considered to be because the oxygen concentration of the semiconductor substrate before being heat-treated does not satisfy the requirement of the concentration to be 9.5×10$^{17}$ atoms/cm$^3$ or less.

Comparative Example 15

A semiconductor substrate, sliced from ingot C shown in Table 1 and having a nitrogen concentration of 8.7×10$^{14}$ atoms/cm$^3$, an oxygen concentration of 8.8×10$^{17}$ atoms/cm$^3$ and an OPP signal strength of 1.585 V, was heat-treated for 4 hours at the temperature of 1150° C. in an atmosphere consisting of 25% hydrogen and 75% argon. As a result, the oxygen concentration at the depth of 1 μm was 3.3×10$^{16}$ atoms/cm$^3$, the depth of the denuded zone of the void type defect was 8 μm, the depth of denuded zone by GOI evaluation was 6 μm, the BMD density was 1×10$^9$/cm$^3$ or more and the N spike depth was 8 μm. All the depths are considered to be decreased since the heat-treating temperature was 50° C. lower than 1200° C.

Next, explanations will be given, with reference to Table 6, as to the examples in which a semiconductor substrate sliced of a silicon single crystal pulled up at a cooling rate of 1° C./min or more and less than 5° C./min at 1100° C. is treated under heating.

TABLE 6

| Example | Ingot | Nitrogen concentration (atoms/cm$^3$) | Oxygen concentration (atoms/cm$^3$) | Cooling rate during pulling-up (° C./min) | OPP signal strength (V) | Heat treatment temperature × time (° C. × h) | Oxygen concentration at a depth of 1 μm (atoms/cm$^3$) | Depth of a denuded zone of a void type defect (μm) | Depth of a denuded zone by GOI evaluation (μm) | BMD density (1/cm$^3$) | N spike depth (μm) |
|---|---|---|---|---|---|---|---|---|---|---|---|
| 13 | G | 12 × 10$^{14}$ | 7.2 × 10$^{17}$ | 4.5 | 1.26 | 1200 × 2 | 2.7 × 10$^{16}$ | 12.5 | 12.5 | >1 × 10$^9$ | 13.4 |
| 14 | G | 40 × 10$^{14}$ | 8.5 × 10$^{17}$ | 4.5 | 1.26 | 1200 × 2 | 3.2 × 10$^{16}$ | 12.5 | 12.5 | >1 × 10$^9$ | 13.4 |
| 15 | H | 15 × 10$^{14}$ | 8.1 × 10$^{17}$ | 2.5 | 6.31 | 1200 × 2 | 3 × 10$^{16}$ | 12.5 | 12.5 | >1 × 10$^8$ | 13.4 |
| 16 | H | 32 × 10$^{14}$ | 7.5 × 10$^{17}$ | 2.5 | 1.26 | 1200 × 2 | 2.8 × 10$^{16}$ | 12.5 | 12.5 | >1 × 10$^9$ | 13.4 |

TABLE 6-continued

| Example | Ingot | Nitrogen concentration (atoms/cm$^3$) | Oxygen concentration (atoms/cm$^3$) | Cooling rate during pulling-up (° C./min) | OPP signal strength (V) | Heat treatment temperature × time (° C. × h) | Oxygen concentration at a depth of 1 μm (atoms/cm$^3$) | Depth of a denuded zone of a void type defect (μm) | Depth of a denuded zone by GOI evaluation (μm) | BMD density (1/cm$^3$) | N spike depth (μm) |
|---|---|---|---|---|---|---|---|---|---|---|---|
| 17 | D | 27 × 10$^{14}$ | 6.6 × 10$^{17}$ | 2.5 | 1.995 | 1200 × 1 | 3.5 × 10$^{16}$ | 12.5 | 12.5 | >1 × 10$^9$ | 12.8 |
| 18 | H | 41 × 10$^{14}$ | 7 × 10$^{17}$ | 2.5 | 1.585 | 1200 × 1 | 3.7 × 10$^{16}$ | 12.5 | 12.5 | >1 × 10$^9$ | 12.8 |

Examples 13 to 18

These examples are sliced from ingots shown in the second column in Table 6 and have nitrogen concentrations shown in the third column and oxygen concentrations shown in the fourth column. As shown in the fifth column, the cooling rate is less than 5° C./min at the temperature of 1100° C. when pulling up the single crystal using Czochralski method or magnetic field-applied Czochralski method. In the sixth column, the maximum signal strengths, measured at the centre of the semiconductor substrate by infrared interference method (OPP), are shown; in the seventh column, the heat-treatment temperature and time in an atmosphere of 25% hydrogen and 75% argon are shown; in the eighth column, the oxygen concentration in the centre of the semiconductor substrate is shown. The depth of the denuded zone of the void type defect, the depth of denuded zone by GOI evaluation, the BMD density and N spike depth are shown respectively in the ninth, tenth, eleventh and twelfth columns.

It can be seen from these examples that even when a semiconductor substrate is sliced from an ingot pulled up at the cooling rate of less than 5° C./min at the temperature of 1100° C. using Czochralski method or magnetic field-applied Czochralski method, the depth of the denuded zone of the void type defect and the depth of denuded zone by GOI evaluation can both reach 12.5 μm when performing heat-treatment for one hour or two hours at the temperature of 1200° C., when the substrate has an oxygen concentration of 8.5×10$^{17}$ atoms/cm$^3$ or less, a nitrogen concentration of 1×10$^{15}$ atoms/cm$^3$ or more and 1×10$^{16}$ atoms/cm$^3$ or less and an OPP signal strength of 7 V or less. Therefore, it is understood that the depth of the denuded zone is also 12.5 μm, the N spike depth is 13.4 μm or 12.8 μm and that the semiconductor substrate has a locally densified portion produced by nitrogen segregation and exhibiting a signal strength two or more times the average signal strength at the depth of 12 μm or more below the surface thereof when measuring the concentration of nitrogen using secondary ion mass-spectroscopy (SIMS). Further, it is understood that the BMD density is greater than 1×10$^9$/cm$^3$. Also, the density at the depth of 1 μm is at the value of 2.7×10$^{16}$ to 3.7×10$^{16}$ atoms/cm$^3$ and the oxygen concentration at the centre of the thickness of the semiconductor substrate is lower than the concentration in the semiconductor substrate before being heat-treated.

Such an effect as mentioned above can be obtained when the cooling rate at the temperature of 1100° C. is 1° C./min or more and less than 5° C./min when pulling up the single crystal and by treating the semiconductor substrate, having an oxygen concentration of 8.5×10$^{17}$ atoms/cm$^3$ or less and a nitrogen concentration of 1×10$^{15}$ atoms/cm$^3$ or more and 1×10$^{16}$ atoms/cm$^3$ or less and an OPP signal strength of 7 V or less, for at least one hour and advantageously one hour to two hours at the temperature of 1200° C. or more and 1300° C. or less in a non-oxidising atmosphere.

Comparative Examples 16 to 23

On the contrary, the quality of the semiconductor substrates declines in Comparative Examples 16 to 23 illustrating the case where the nitrogen concentration, oxygen concentration and heat-treatment condition do not satisfy the present invention, as shown in Table 7.

TABLE 7

| Comparative Example | Ingot | Nitrogen concentration (atoms/cm$^3$) | Oxygen concentration (atoms/cm$^3$) | Cooling rate during pulling-up (° C./min) | Heat treatment temperature × time (° C. × h) | Depth of a denuded zone of a void type defect (μm) | Depth of a denuded zone by GOI evaluation (μm) | BMD density (1/cm$^3$) | N spike depth (μm) |
|---|---|---|---|---|---|---|---|---|---|
| 16 | Q | 13 × 10$^{14}$ | 8.9 × 10$^{17}$ | 4.5 | 1200 × 2 | 9 | 9 | >1 × 10$^9$ | 13.4 |
| 17 | Q | 25 × 10$^{14}$ | 8.7 × 10$^{17}$ | 4.5 | 1200 × 2 | 10 | 10 | >1 × 10$^9$ | 13.4 |
| 18 | R | 15 × 10$^{14}$ | 8.7 × 10$^{17}$ | 2.5 | 1200 × 2 | 10 | 10 | >1 × 10$^9$ | 13.4 |
| 19 | R | 30 × 10$^{14}$ | 8.6 × 10$^{17}$ | 2.5 | 1200 × 2 | 10 | 10 | >1 × 10$^9$ | 13.4 |
| 20 | E | 7.2 × 10$^{14}$ | 8.2 × 10$^{17}$ | 4.5 | 1200 × 2 | 7 | 7 | >1 × 10$^9$ | 13.4 |
| 21 | F | 9.1 × 10$^{14}$ | 7.5 × 10$^{17}$ | 2.5 | 1200 × 2 | 8 | 8 | >1 × 10$^9$ | 13.4 |
| 22 | H | 31 × 10$^{14}$ | 7.9 × 10$^{17}$ | 2.5 | 1150 × 8 | 6 | 6 | >1 × 10$^9$ | 10.5 |
| 23 | H | 28 × 10$^{14}$ | 7.6 × 10$^{17}$ | 2.5 | 1150 × 4 | 3 | 3 | >1 × 10$^9$ | 8 |

In these comparative examples, a mixture consisting of 25% hydrogen and 75% argon was used for the heat-treating atmosphere.

In Comparative Examples 16, 17, 18 and 19, the oxygen concentration is 8.9 atoms/cm$^3$ to 8.6 atoms/cm$^3$, which does not correspond to the condition for the oxygen concentration of 8.5 atoms/cm$^3$ or less.

In Comparative Examples 20 and 21, the nitrogen concentration is 7.2×10$^{14}$ atoms/cm$^3$ and 9.1 atoms/cm$^3$, which does not correspond to the condition for the lower limit of the nitrogen concentration of 1×10$^{15}$ atoms/cm$^3$ or more.

In Comparative Examples 22 and 23, the heat-treating temperature is 1150° C., which does not correspond to the condition for the lower limit of the heat treating temperature of 1200° C.

As aforementioned, when the conditions according to the invention are not selected as the oxygen concentration, nitrogen concentration and heat-treating temperature and time of the semiconductor substrate sliced from a crystal pulled up at the cooling rate of 1° C./min or more and less than 5° C./min at the temperature of 1100° C. using Czochralski method or magnetic field-applied Czochralski method, the depth of the denuded zone of the void type defect and the depth of denuded zone by GOI evaluation both do not get the desired value.

It is to be noted that also in the above examples, the heat-treating temperature is advantageously 1200° C. or more and 1300° C. or less. The heat treatment must be carried out for at least one hour and preferably two hours or less, from the productive point of view.

EFFECT OF THE INVENTION

According to the present invention, by heat-treating a semiconductor substrate for at least one hour at the temperature of 1200° C. in a non-oxidising atmosphere, by selecting the prescribed range of each value of the nitrogen concentration, oxygen concentration and OPP signal strength thereof, wherein the semiconductor substrate is sliced from a silicon single crystal ingot grown by using Czochralski method or magnetic field-applied Czochralski method, where the nitrogen concentration in the melt is selected and where the cooling rate is 5° C./min or more, or 1° C. or more and less than 5° C., a semiconductor substrate can be obtained in which the depth of the denuded zone of the void type defect and the depth of denuded zone by GOI evaluation are both made larger than 12 $\mu$m, or the depth of the denuded zone is made larger than 12 $\mu$m and having a locally densified portion produced by nitrogen segregation and exhibiting a signal strength two or more times the average signal strength at a depth of 12 $\mu$m or more below the surface thereof when measuring the concentration of nitrogen by secondary ion mass-spectroscopy. Thus, the freedom in the area on the semiconductor substrate for the production of electronic devices can be increased and the density of the crystal defect of oxygen precipitates can be made larger than $5\times10^8/cm^3$ or more whereby the intrinsic gettering effect can be improved.

What is claimed is:

1. A silicon semiconductor substrate obtained from a silicon single crystal grown by a method selected from the group consisting of Czochralski method and a magnetic field-applied Czochralski method, comprising a substrate having a center and a surface and a thickness therebetween, and a denuded zone having a depth of at least 12 $\mu$m below the surface after the silicon semiconductor substrate is heat-treated in a non-oxidizing atmosphere; and said substrate having a crystal defect density of oxygen precipitates of at least $5\times10^8/cm^3$, at the center of the thickness of the silicon semiconductor substrate.

2. A semiconductor substrate according to claim 1, wherein a concentration of oxygen at a depth of 1 $\mu$m below the surface of the semiconductor substrate is up to $5\times10^{16}$ atoms/cm$^3$ and the concentration of oxygen at the center of the thickness of the semiconductor substrate is up to $9.5\times10^{17}$ atoms cm$^3$ after the silicon substrate is heat-treated in an non-oxidizing atmosphere; and said substrate before being heat-treated having an oxygen concentration of up to $9.5\times10^{17}$ atoms/cm$^3$ and a nitrogen concentration of at least $5\times10^{14}$ atoms/cm$^3$ and up to $1\times10^{16}$ atoms/cm$^3$ and having a maximum signal strength of up to 2 V which is measured at the center thereof by infrared interference method (OPP).

3. A semiconductor substrate according to claim 1, wherein a concentration of oxygen at a depth of 1 $\mu$m below the surface of the semiconductor substrate is up to $5\times10^{16}$ atoms/cm$^3$ and the concentration of oxygen at the center of the thickness of the semiconductor substrate, is up to $8.5\times10^{17}$ atoms/cm$^3$ after the silicon substrate is heat-treated in a non-oxidizing atmosphere; and said substrate before being heat-treated has an oxygen concentration of up to $8.5\times10^{17}$ atoms/cm$^3$ and a nitrogen concentration of at least $1\times10^{15}$ atoms/cm$^3$ and up to $1\times10^{16}$ atoms/cm$^3$ and has a maximum signal strength of up to 7 V which is measured at the center thereof by an infrared interference method (OPP).

4. A semiconductor substrate comprising a substrate having a surface, a center, and a thickness between said surface and said center;

an oxygen concentration at the center of the thickness of the substrate being up to $9.5\times10^{17}$ atoms/cm$^3$, after said substrate is heat-treated in a non-oxidizing atmosphere;

said substrate having a locally densified portion produced by nitrogen segregation and exhibiting a signal strength at least two times an average signal strength at a depth of at least 12 $\mu$m below the surface thereof when measuring a concentration of nitrogen by secondary ion mass-spectroscopy (SIMS); and said substrate having a depth of a denuded zone of a void defect being at least 12 $\mu$m and a crystal defect density of oxygen precipitates at the center of the thickness thereof being at least $5\times10^8/cm^3$.

5. A semiconductor substrate according to claim 4, wherein said substrate has a concentration of oxygen at a depth of 1 $\mu$m below the surface of up to $5.0\times10^{16}$ atoms/cm$^3$ and has a concentration of oxygen at the center of the thickness of the semiconductor substrate of up to $9.5\times10^{17}$ atoms/cm$^3$ after the silicon substrate is heat-treated in a non-oxidizing atmosphere; and said substrate before being heat-treated has an oxygen concentration of up to $9.5\times10^{17}$ atoms/cm$^3$ and a nitrogen concentration of at least $2\times10^{14}$ atoms/cm$^3$ and up to $1\times10^6$ atoms/cm$^3$ and has a maximum signal strength of up to 4 V which is measured at a center thereof by an infrared interference method (OPP).

6. A semiconductor substrate according to claim 4, wherein said substrate has a concentration of oxygen at a depth of 1 $\mu$m below the surface of up to $5.0\times10^{16}$ atoms/cm$^3$ and has a concentration of oxygen at the center of the thickness of the semiconductor substrate up to $8.5\times10^{17}$ atoms/cm$^3$ after the silicon substrate is heat-treated in a non-oxidizing atmosphere; and said substrate being obtained from a silicon single crystal which has an oxygen concentration of up to $8.5\times10^{17}$ atoms/cm$^3$ and a nitrogen concentration of at least $1\times10^{15}$ atoms/cm$^3$ and up to $1\times10^{16}$ atoms/cm$^3$ and a maximum signal strength of up to 7 V which measured at the center thereof by an infrared interference method (OPP).

7. A process for producing a silicon semiconductor substrate, comprising obtaining a silicon semiconductor substrate, having an oxygen concentration of up to $9.5\times10^{17}$ atoms/cm$^3$ and being obtained from a silicon single crystal;

said silicon single crystal grown by using a silicon melt solution containing at least $5 \times 10^{17}$ atoms/cm$^3$ and up to $1.5 \times 10^{19}$ atoms/cm$^3$ of nitrogen through a method selected from the group consisting of Czochralski method and a magnetic field-applied Czochralski method;

heat-treating said substrate for at least one hour at a temperature of at least 1200° C. in a non-oxidizing atmosphere; and cooling said substrate at a cooling rate of at least 5° C./minute at a temperature of 1100° C.

8. A process for producing a silicon semiconductor substrate, comprising obtaining a silicon semiconductor substrate, having an oxygen concentration of up to $9.5 \times 10^{17}$ atoms/cm$^3$ and being obtained from a silicon single crystal;

said silicon single crystal grown by using a silicon melt solution containing at least $2 \times 10^{17}$ atoms/cm$^3$ and up to $1.5 \times 10^{19}$ atoms/cm$^3$ of nitrogen through a method selected from the group consisting of Czochralski method and a magnetic field-applied Czochralski method;

heat-treating said substrate for at least one hour at a temperature of at least 1200° in a non-oxidizing atmosphere; and cooling said substrate at a cooling rate of at least 5° C./minute at a temperature of 1100° C.

9. A process for producing a silicon semiconductor substrate, comprising obtaining a silicon semiconductor substrate, having an oxygen concentration of up to $8.5 \times 10^{17}$ atoms/cm$^3$ and being obtained from a silicon single crystal;

said silicon single crystal grown by using a silicon melt solution containing at least $1. \times 10^{18}$ atoms/cm$^3$ and up to $1.5 \times 10^{19}$ atoms/cm$^3$ of nitrogen through a method selected from the group consisting of Czochralski method and a magnetic filed-applied Czochralski method;

heat-treating said substrate for at least one hour at a temperature of at least 1200° C. in a non-oxidizing atmosphere; and cooling said substrate at a cooling rate of at least 1° C./minute and less than 5° C./minute at a temperature of 1100° C.

* * * * *